SEMICONDUCTOR STRUCTURES FOR MICROWAVE PARAMETRIC AMPLIFIERS

Filed March 2, 1964

INVENTOR
MAURICE G. BERNARD
BY
Abraham A. Saffitz
ATTORNEY

United States Patent Office 3,226,268

Patented Dec. 28, 1965

3,226,268

SEMICONDUCTOR STRUCTURES FOR MICROWAVE PARAMETRIC AMPLIFIERS

Maurice G. Bernard, 56 Avenue Victor Cresson, Issy-les-Moulineaux, France

Filed Mar. 2, 1964, Ser. No. 348,534
Claims priority, application France, Mar. 11, 1959, 789,076, Patent 1,228,285
3 Claims. (Cl. 148—33.2)

The present invention which is a continuation in part of U.S. application Serial Number 11,757, filed February 29, 1960, now abandoned, in the name of the present applicant relates to improvements in semiconductor junctions of the p-n type constituting a nonlinear reactance which can be used as a modulating element in devices known under the name "parametric amplifiers."

It is already known, particularly from the article by J. M. Manley and H. E. Rowe in the U.S. periodical Proceedings of the Institute of Radio Engineers, volume 44, No. 7, July 1956, pages 904 to 913, and from the article by H. E. Rowe in the above-mentioned U.S. periodical, volume 46, No. 5, May 1958, pages 850 to 860 (Some General Properties of Nonlinear Elements, Part I: General Energy Relations, Part II: Small Signal Theory), that a nonlinear reactance arranged in an appropriate circuit allows the amplification of an electric signal of frequency $f_1$ by deriving electrical energy from a generator of frequency $f_2$. Such a principle of amplification is known as parametric amplification or amplification by variable nonlinear reactance.

It is also known, particularly from the article by D. Leenov, entitled "Gain and Noise Figure of a Variable Capacitance Up-Converter," published in the U.S. periodical The Bell System Technical Journal, volume 37, No. 4, July 1958, pages 989 to 1008 and, more particularly, from the article by A. Uhlir, entitled "The Potential of Semi-Conductor Diodes in High-Frequency Communications" published in the U.S. periodical Proceedings of the Institute of Radio Engineers, volume 46, No. 6, June 1958, pages 1099 to 1115, that a p-n semiconductor junction generally introduces a capacitance which is variable as a nonlinear function of the polarization voltage which is applied to it and can thus, in certain conditions, be used in the design of a parametric amplifier working at very high frequencies with a very low noise factor.

If a p-n junction is represented by a lumped-parameter equivalent circuit comprising a variable nonlinear capacitance C shunted by a resistance $R_P$, the combination (C, $R_P$) being in series with a resistance $R_S$, it will be seen that, to obtain a parametric amplifier responsive to high frequencies and having a very low noise factor, it is necessary that at the angular frequencies $\omega$ employed, the junction behaves very approximately as a pure reactance, that is to say its impedance remains about $1/jC\omega$, whatever the value assumed by the capacitance C during the phenomena of modulation which take place in the parametric amplifier, a condition which is substantially obtained when the inequality $1/R_PC \ll \omega \ll 1/R_SC$ is true.

To make $1/R_PC$ very small, it is necessary for $R_P$ to be a very large resistance, and this is easily obtained by inverse polarization of the p-n junction.

A typical value for the resistance $R_P$ is: for germanium $R_P=10^5$ to $10^6$ ohms, for silicon $R_P=10^7$ to $10^8$ ohms.

For $1/R_SC$ to be very large, C and $R_S$ must be very small. The achievement of about one picofarad for the capacitance C and one ohm for the resistance $R_S$ is known. In these conditions $1/R_PC$ has values of the order of one megacycle for germanium and falls to 10 kilocycles for silicon; $1/R_SC$ reaches values of several hundreds of gigacycles per second.

With regard to the noise factor, this becomes less as the resistance $R_S$ decreases; in fact, the amplifier element being constituted by the reactance of the p-n junction, the principal source of noise is the ohmic resistance $R_S$.

Referring again to the above-mentioned article by D. Leenov (page 998, Formula 32), it will be seen that the maximum gain of an "upper side-band" parametric amplifier ("up-converter") of the p-n junction kind for microwaves is given by an expression in the form:

$$C_{max}=\frac{f_2}{f_1}\frac{1}{(x+\sqrt{1+x^2})^2} \qquad (1)$$

in which:

$f_1$ is the frequency of the signal to be amplified;
$f_2$ is the frequency of the amplified signal;
$(f_2-f_1)$ is the frequency of the auxiliary generator from which the energy is derived for the amplification of the signal of frequency $f_1$;
$x$ is a reduced variable given by the equation:

$$x=\mu\frac{(\mu+1)}{\mu-1}\frac{\sqrt{f_1f_2}}{f_c}$$

with $$\mu=\sqrt{\frac{C_{max}}{C_{min}}}$$

i.e., the square root of the ratio $C_{max}/C_{min}$ of the largest and smallest capacitances attainable for the p-n junction and $$f_c=\frac{1}{2\pi RC_{min}}$$

a figure of merit for the p-n junction which is expressed in the form of a cut-off frequency.

The smallest capacitance $C_{min}$ attainable is determined by the limitation on reverse bias voltage imposed by breakdown, and the optimum value of $C_{max}/C_{min}$ given by D. Leenov in the above-mentioned article (page 1008, Formula 71), is:

$$\frac{C_{max}}{C_{min}}=\mu^2=(1+\sqrt{2})^2=5.83$$

For a lower side-band parametric amplifier ("down-converter"), it is shown in the same way that the p-n junction device amplifies frequencies which are the higher, the greater the figure of merit $f_c$.

The abovementioned different considerations show that the working of a parametric amplifier depends on the product of the minimum capacitance $C_{min}$ of the junction and its series resistance $R_S$ and on the ratio of the maximum and minimum junction capacitances.

According to W. Shockley (see particularly his article entitled "The Theory of P–N Junctions in Semiconductors and P–N Junction Transistors," published in the U.S. periodical "The Bell System Technical Journal," volume, 28, July 1949, pages 435 to 489), the minimum capacitance $C_{min}$ is given by a formula which can be written in the following abbreviated form:

$$C_{min}=Ka^{1/3}SV_{max}^{-1/3} \quad (2)$$

in which:

$V_{max}$ is the reverse polarization voltage taking into account the difference of contact potential;

$a$ is the gradient of uncompensated impurities in the neighbourhood of the p-n junction, generally known as the impurity gradient and given by the formula $N_d-N_a=ax$ where $N_d$ is the density of donors, $N_a$ the density of acceptors and $x$ the distance to the junction;

S is the cross-sectional area of the p-n junction;

K is a constant.

As the main part of the resistance $R_S$ is situated on a single side of the junction, in the least conductive region, it is current practice to give this region a large cross-section $\sigma$ up to the neighbourhood of the junction. In this case the resistance $R_S$ is not inversely proportional to the area of the junction but is given by a well known approximate formula (see for example L. Vales, Proceedings of the Institute of Radio-Engineers, vol. 42, 1954, page 480);

$$R_S=\frac{\rho}{2\pi b}=\frac{\rho}{2\sqrt{\pi\sigma}}$$

in which $\rho$ is the resistivity in ohms of the region in question and $b$ is the radius in centimeters of the p-n junction which is assumed to be circular.

The Formulae 2 and 3 show that the capacitance $C_{min}$ decreases proportionally to the cross-section $\sigma$ of the p-n junction while the resistance $R_S$ increases inversely as the square root of the cross-section. The product $R_SC_{min}$ thus varies as the square root of the cross-section $\sigma$ which must therefore be small. To reduce the resistance $R_S$ the resistivity $\rho$ can also be decreased by increasing the doping of the base substance, but this causes a decrease in the peak inverse voltage $V_{max}$ which the junction can withstand and consequently an increase in the minimum capacitance $C_{min}$ which can be achieved.

More particularly, if it is advantageous to choose a very small value for the resistivity $\rho$, it is essential to give it values at least equal to 0.001 ohm-centimeter because for smaller values the peak voltage $V_{max}$ that the junction can withstand will be too small for any use.

The best results known in the prior art have been obtained with silicon diodes in which the junction is achieved by diffusion with an impurity gradient from $10^{23}$ to $10^{24}$ atoms per cm.$^3$ per cm. The figures of merit obtained are, according to the abovementioned article by Uhlir, from 60 to 120 gigacycles per second, and can reach 200 gigacycles per second according to the abovementioned article by Leenov.

From the preceding considerations, it can be deduced that the factors which can be usefully varied to achieve better results are:

(a) the impurity gradient $a$ at the level of the junction;
(b) the ratio $C_{max}/C_{min}$.

The present invention relates to improved nonlinear capacitance junction diodes for microwave parametric amplifiers, which have a higher figure of merit and a lower noise factor than the known nonlinear capacitance diodes of the prior art, and a manufacturing process for such junctions which allows very satisfactory manufacturing tolerances to be achieved.

More particularly the nonlinear capacitance diodes of the invention comprise a semiconductor body and in said body a n-p junction having an impurity gradient along a given axis comprised between $10^{19}$ and $10^{21}$ atoms per cm.$^3$ per cm. and located in a truncated conical region having the same axis and a half apex-angle of 89 to 80°, whereby the ratio of the maximum capacitance of the junction, under zero voltage, to its minimum capacitance, under the peak inverse voltage which it can withstand has an optimum value.

The manufacturing process of the invention consists in making the junction by pulling semiconductor body at the speed necessary to obtain the desired impurity gradient and then etching the said body in order to locate the junction thus made in a suitable truncated conical region.

The invention will be better understood from the following detailed description with reference to the accompanying drawings, in which:

FIG. 1 shows the appearance of a p-n junction diode according to the invention.

Figure 1:
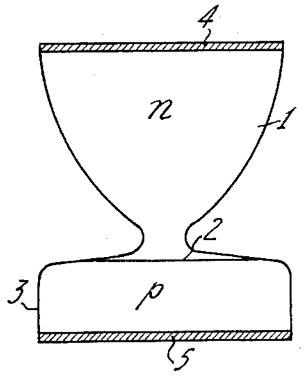
FIG. 1 shows a nonlinear capacitance diode according to the invention.

This structure is provided in a semi-conductor body comprising an n-type region 1 and a p-type region 3 and a junction 2 located in an intervening space charge region shown as the depletion layer. At the ends of these regions 1 and 3 are provided ohmic contacts 4 and 5.

Figure 2:
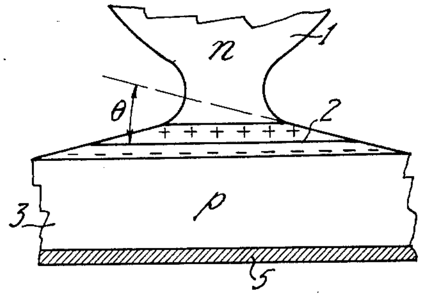
FIG. 2 shows schematically the distribution of charges in the junction of FIG. 1; and, FIG. 3 shows curves of capacitance variation as a function of the inverse voltage applied for various types of nonlinear capacitance diodes.
Figure 3:
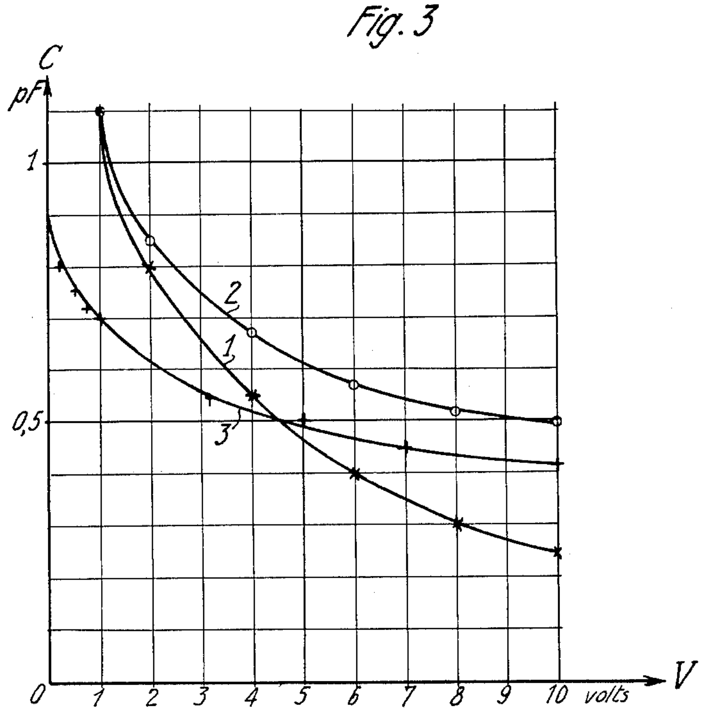

The base 3 constituted by the p-type region terminates in a very flattened truncated cone which continues into a narrowed portion cut in the n-type region. The half apex-angle of said very flattened truncated cone with an axis perpendicular to the plane of junction 2 is equal to 90 degrees minus a few degrees and comprised between 89 and 80 degrees. The junction is not placed at the level of the minimum cross-section but in the truncated conical region where the variation of the cross-section area is maximum, which causes a variation of capacitance versus voltage more rapid than the inverse ration of the cube root of the voltage. In fact, when a junction reversedly biased by a voltage V is compared with a condenser the electrodes of which are the layers of opposite charges situated on both sides of the junction, as has been done in the above-mentioned article by William Shockley, it is found that the capacitance varies as the inverse of the cube root of the voltage V, because the surface of these electrodes, the spacing of which follows this rule, is assumed to be constant. The junction being formed, as shown in FIGS. 1 and 2, in a conical section the apex-angle $(90-\theta)°$ of which is very near 90°, an increase in V causes an appreciable decrease in the area of the electrode nearest the constriction, while the area of the other electrode slightly increases. There results a reduction in the effective condenser surface at the junction at the same time as an increase in the distance betwen these electrodes, proportional to $V^{1/3}$ whence a decrease in the capacitance more rapid than would be represented by the law $V^{-1/3}$. This increase in the nonlinearity of variation of the capacitance as a function of the reverse voltage applied is clearly shown by a comparison of the curves 1 and 2 in FIG. 3, obtained experimentally. Curve 1 corresponds to a nonlinear capacitance diode having a circular junction of a diameter equal to 100$\mu$, located in a truncated conical region having a half apex-angle comprised between $(90-1)°$ and $(90-10)°$, the impurity gradient along the conical region axis being $10^{20}$ atoms per cm.$^3$ per cm. The facteur $\mu=\sqrt{C_{max}/_{min}C}$ is then accordingly comprised between 2 and $\sqrt{6}$ and very near its optimal value $(1+\sqrt{2})$ calculated by D. Leenov in the above-mentioned article. The curve 2 corresponds to a junction of the same gradient and same cross-section but located in the narrowest part of the constriction formed between the n and p regions, that is to say in a cylindrical section of which the lines of revolution make with the plane of the junction an angle of 90°. The curve 3 shown for comparison in FIG. 3 on the same scale as curves 1 and 2, is taken from the FIG. 8 of the above-mentioned article by Uhlir. It represents the variation, as a function of the reverse applied voltage, of the capacitance of the "mesa-diode" in which the gradient is from $10^{23}$ to $10^{24}$ atoms per cm.$^3$ per cm. and the junction is located in a substantially cylindrical section.

Another effect of the arrangement of the invention which is also very advantageous is that the direct resistance $R_s$ of the junction has a slight tendency to decrease when the reverse voltage increases. It is in fact in the p-type region where the main part of the resistance $R_s$ is located that the largest electrode is found and as the area of this electrode increases with V, the resistance $R_s$ is reduced when V increases.

Thus the desired conditions for obtaining a parametric amplifier of maximum gain and minimum noise are obtained.

The process of manufacturing nonlinear capacitance diodes with this structure is as follows:

A semiconductor substance, preferably germanium, is used for the manufacture of a monocrystal which comprises two regions of which one is of n-type conductivity and the other of p-type conductivity.

Assuming that the junction is formed in the p-n direction, the following is the order of operation:

(1) Introduction into the bath, for example of germanium, of a suitable proportion of acceptor impurities such as indium or gallium for obtaining a p-type semiconductor of predetermined impurity concentration $N_a$ comprised between $5.10^{17}$ and $5.10^{18}$ and consequently of predetermined resistivity of the order of 0.01 ohm-centimeter;

(2) Pulling a given length of p-type monocrystal, by example about 1 mm.;

(3) The addition, progressively if required, of the desired quantity of donor impurities such as antimony or arsenic in order to change the bath from p-type to n-type and to obtain a predetermined impurity concentration $N_d$—$N_a$ comprised between $5.10^{18}$ and $5.10^{19}$ and consequently a predetermined resistivity of the order of 0.002 ohm-centimeter of n-type, while the pulling of the monocrystal proceeds at a speed comprised between 150 and 250 millimeters per hour in order to obtain a predetermined impurity gradient comprised between $10^{21}$ and $10^{19}$ atoms per cm.$^3$ per cm.;

(4) Pulling a given length of the n-type monocrystal, by example about 2 mm.;

(5) Cutting in the monocrystal of cylindrical or parallelepiped rods of very small dimensions by means of a saw or an ultrasonic device so that each of these rods contain a p-n junction. Their length is between 2 and 3 millimeters and their cross-section area is of the order of 0.5 square millimeter;

(6) These rods are then provided at their ends with soldered connections 4 and 5;

(7) The connections 4 and 5 being covered with a protective varnish, the diode rods are placed in an electrolytic bath and subjected to a selective electrolytic action according to the known method which consists in reversedly biasing the diode immersed in the electrolyte and which is based on the fact that the resistance to the pasage of the current through the junction is shunted by the electrolyte which confines preferentially the attack at the n-type region to a greater or lesser degree according to the reverse bias voltage and to the conductivity of the electrolyte.

An electrolyte having given good results is a weak solution of potash having a resistivity above 1000 ohm-centimeters i.e. a solution containing from 0.01 gr. to 0.1 gr. of KOH per liter of water.

It is thus possible to obtain, by a suitable choice of the electrolyte, the durations of electrolysis and the current circulating in the electrolytic tank, a constriction of a predetermined diameter in the n-type region and a junction of predetermined cross-section located in a truncated cone of optimum apex-angle.

A good method for obtaining accurate results consists of dividing the electrolytic etching into two successive steps, the first of which with a given etching current, by example between 5 and 10 milliamperes for coarse operation, and the second with a weaker current, by example between 2 and 5 milliamperes for sharp finishing.

To conclude, by way of example, the principal dimensions, the manufacturing characteristics and the performance of a p-n junction for a microwave parametric amplifier according to the invention, are given below:

Dimensions of the rod:
- Length of the portion of n-type conductivity: 2 mm.
- Length of the portion of p-type conductivity: 1 mm.
- Diameter of the junction: 100 microns.
- Diameter of the construction: of the order of 70 to 80$\mu$.
- Angle $\theta$ from 1 to 10°.

Characteristics of manufacture:
- Nature of the semiconductor substance: germanium.
- Resistivity of the portion of p-type conductivity: 0.01 ohm-centimeter (impurity concentration $10^{18}$ atoms/cm.$^3$).
- Resistivity of the portion of n-type conductivity: 0.002 ohm-centimeter (impurity concentration $10^{19}$ atoms/cm.$^3$).
- Impurity gradient: $a=10^{20}$ atoms per cm.$^3$ per cm.
- Pulling speed: 200 millimeters per hour.
- Electrolytic etching:
  - First step 5 to 10 milliamperes during 2 to 3 hours.
  - Second step 2 to 5 milliamperes during about 1 hour.
- Nature of the electrolyte: weak solution of KOH.
- Resistivity of the electrolyte above 1000 ohm-centimeters.

Electric characteristics:
- Series resistance, $R_S=0.6$ ohm.
- Minimum capacitance, $C_{min}=0.25$ picofarad.
- Figure of merit, $f_c=1000$ gigacycles per second.

What I claim is:

1. A nonlinear capacitance diode for microwave parametric amplifiers comprising a semiconductor body, said body being in the form of elongated generally biconical body portion, said body portion having first and second substantially circular terminal faces, said biconical body having first and second truncated conical sections joined in inverted relation at a reduced cross-sectional throat which consitutes a part of restricted section, said first and second truncated conical sections and faces providing first and second conductivity regions respectively said regions being of opposite conductivity type with a substantially planar junction separating said types, said junction being located in a right cross-section of one of said truncated sections offset from the minimum part of the reduced cross-section of said throat and the lines of revolution of the lower truncated section which meet with the plane of said junction at an angle of 1 to 10 degrees, and the impurity gradient across said junction being of $10^{19}$ to $10^{21}$ atoms per cm.$^3$ per cm. whereby the ratio of the maximum capacitance of said junction to its minimum capacitance is thereby adjusted to its optimum value.

2. A nonlinear capacitance diode for microwave parametric amplifiers comprising a semiconductor body, said body being in the form of elongated generally biconical body portion, said body portion having first and second substantially circular terminal faces, said biconical body having truncated conical sections joined in inverted relation at a reduced cross-sectional throat which constitutes a part of restricted section, said truncated conical section providing first and second conductivity regions respectively, said first and second regions provided in said body portion which are of opposite conductivity type with a substantially planar junction separating said types, said junction being located in a right cross-section of one of said truncated sections offset from the minimum part of the reduced cross-section of said throat and the lines of revolution of the lower truncated section which meet with the plane of said junction at an angle of 1 to 10 degrees, and the impurity gradient across said junction being of $10^{19}$ to $10^{21}$ atoms per cm.$^3$ per cm. whereby the ratio of the maximum capacitance of said junction to its minimum capacitance is comprised between the limits 4 and 6 encompassing narrowly the optimum value $(1+\sqrt{2})^2$ of said ratio.

3. A nonlinear capacitance diode for microwave parametric amplifiers comprising a semiconductor body, said body being in the form of elongated generally biconical body portion, said body portion having first and second substantially circular terminal faces, said biconical body having truncated conical sections joined in inverted relation at a reduced cross-sectional throat which constitutes a part of restricted section, said terminal faces and truncated conical sections providing first and second conductivity regions respectively, a n-type semiconductive region of the body which includes said first terminal face, said first truncated section, said reduced cross-sectional throat at the intermediate location and a portion of said second truncated conical section, a p-type semiconductive region of said body which includes said second terminal face and the remaining portion of said second truncated conical section, said n-type semiconductive region and p-type semiconductive region being separated by a junction, said second truncated conical section which is located at the lower portion of said biconical body having its lines of revolution making a sharply oblique angle with the plane of said junction, said oblique angle being an angle of 1 to 10 degrees and said junction having an impurity gradient of $10^{19}$ to $10^{21}$ atoms per cm.$^3$ per cm., whereby the ratio of the maximum capacitance of said junction to its minimum capacitance is substantially equal to its optimum value $(1+\sqrt{2})^2$.

References Cited by the Examiner

UNITED STATES PATENTS

| | | | |
|---|---|---|---|
| 2,768,914 | 11/1956 | Buchler et al. | 148—1.5 |
| 2,802,159 | 8/1957 | Stump | 148—1.5 |
| 2,822,308 | 2/1958 | Hall | 148—1.5 |
| 2,861,905 | 11/1958 | Indig et al. | 148—1.5 |
| 2,878,147 | 3/1959 | Beale | 148—1.5 |
| 2,885,571 | 5/1959 | Williams | 148—1.5 |
| 2,936,425 | 5/1960 | Shockley. | |
| 3,033,714 | 5/1962 | Ezaki et al. | 148—33 |
| 3,065,115 | 11/1962 | Allen | 148—172 |
| 3,070,465 | 12/1962 | Tsukamoto | 148—172 |
| 3,114,088 | 12/1963 | Abercrombie | 148—33 |

BENJAMIN HENKIN, *Primary Examiner.*

DAVID L. RECK, *Examiner.*